United States Patent [19]

Webb et al.

[11] 4,124,825
[45] Nov. 7, 1978

[54] SIGNAL LEVEL STABILIZER

[75] Inventors: Roderick P. Webb; Raymond C. Hooper, both of Suffolk, England

[73] Assignee: The Post Office, London, England

[21] Appl. No.: 835,370

[22] Filed: Sep. 21, 1977

[30] Foreign Application Priority Data

Sep. 21, 1976 [GB] United Kingdom ............... 39115/76

[51] Int. Cl.² .............................................. H03G 3/30
[52] U.S. Cl. ..................................... 330/279; 330/59; 330/280; 330/308
[58] Field of Search ................. 330/59, 133, 134, 138, 330/278, 279, 280, 308; 250/214 A; 328/2; 307/311

[56] References Cited
U.S. PATENT DOCUMENTS

| | | | |
|---|---|---|---|
| 2,866,015 | 12/1958 | Sailor | 330/133 |
| 3,697,883 | 10/1972 | Wilcox | 330/133 X |
| 3,949,233 | 4/1976 | Gluck | 307/311 X |

Primary Examiner—James B. Mullins
Attorney, Agent, or Firm—Solon B. Kemon; William T. Estabrook

[57] ABSTRACT

A signal level stabilizer includes two amplifier stages, each stage having a respective feed-back loop to control its gain. The gains of the amplifiers are varied in response to variations in the level of the input signal to give a substantially constant output signal. At low levels of the input signal the gain of one of the amplifiers only is varied in response to variations of the input signal and at high levels of the input signal the gain of the other amplifier is varied. The amplifiers may be part of a repeater in an optical communications linkage and one of the amplifiers may then be a photodiode and the other a power amplifier.

10 Claims, 5 Drawing Figures

SIGNAL LEVEL STABILIZER

This invention relates to a level stabiliser. One application of level stabilisers according to the present invention is in stabilising the level of signal derived from a receiver prior to applying the signal to a regenerator in an optical communications system.

In an optical communications link, because of signal attenuation in optical fibres functioning as dielectric optical waveguides, repeaters are necessary, for example at intervals of several kilometers, in order to boost the incoming optical signal and to retransmit it to the next stage of the optical communications link. Such repeaters comprise, essentially, a receiver, which typically takes the form of an avalanche photo diode, an amplifier, and a digital regenerator to launch the boosted optical signal from a transmitter.

In any optical communications system, the input optical signal level at the repeater can vary considerably owing to variations in the attenuation per unit length of optical fibre, to variations in route length and to variations in transmitter power levels.

A receiving photo diode and its following regenerating circuitry must ensure that:

(i) the signal level fed to the regenerator is maintained substantially constant;
(ii) the noise level is held sufficiently low to give an acceptable bit error rate.

A further problem in stabilizing the signal in the repeater itself arises owing to ambient temperature fluctuations particularly in the receiving photo diode; the current gain of an avalanche photo diode is temperature sensitive in excess of 2%° C. and the level of noise is dependent on the photo diode gain.

Consequently, any level control or stabilising system has to compensate for both fluctuations in received optical power and temperature effects on the photo diode gain.

According to the present invention there is provided a signal level stabilizer including first and second input signal amplifying means; first and second feedback loops controlling respectively the gains of the first and second amplifying means to provide a stabiliser gain which maintains a stabiliser output signal at a substantially constant amplitude, the stabiliser being such that the gain of one of said amplifiers is varied in response to variations in the input signal level when the required stabiliser gain is within a first predetermined range and the gain of the other of said amplifiers is varied in response to variations in the input signal level when the required stabiliser gain is within a second predetermined range.

The first feedback loop may control the gain of the first amplifying means between upper and lower limits, and the second feedback loop may control the gain of the second amplifying means between upper and lower limits, the first feedback loop being operative to vary the gain of the first amplifying means in response to variations in the level of the input signal when the input signal is at a low level and the second feedback loop being operative to vary the gain of the second amplifying means in response to variations in the level of the input signal, when the input signal has a magnitude such that the gain of the first amplifying means is reduced to its lower limit.

The first feedback loop may include a first comparator and said second feedback loop may include a second comparator, the first and second comparators being operative to compare the stabiliser output signal with respective reference signals, the reference signal of the second comparator being fractionally larger than the reference signal of the first comparator.

The first amplifying means may be an avalanche photo diode, the second amplifying means may be a power amplifier and the input signal may be an optical signal.

The output signal from the first comparator may control the gain of the photo diode via a dc to dc converter.

The dc to dc converter may include a primary induction coil connected to a reservoir capacitor, the current through the primary induction coil being controlled by the output signal from the first comparator thereby controlling the charge on the reservoir capacitor, the reservoir capacitor providing the biasing voltage for the photo diode.

The dc to dc converter may include a secondary coil inductively coupled to said primary induction coil and operative to provide a low voltage output representative of the photo diode biasing voltage, and the stabiliser may include a third comparator which is operative to compare said low voltage output with a reference voltage to produce an output signal which prevents the biasing voltage of the photodiode being decreased below a level corresponding to said lower limit of the photo diode gain.

An embodiment of the invention will now be described, by way of example only, with reference to the accompanying diagrammatic drawings in which.

Figure 1:
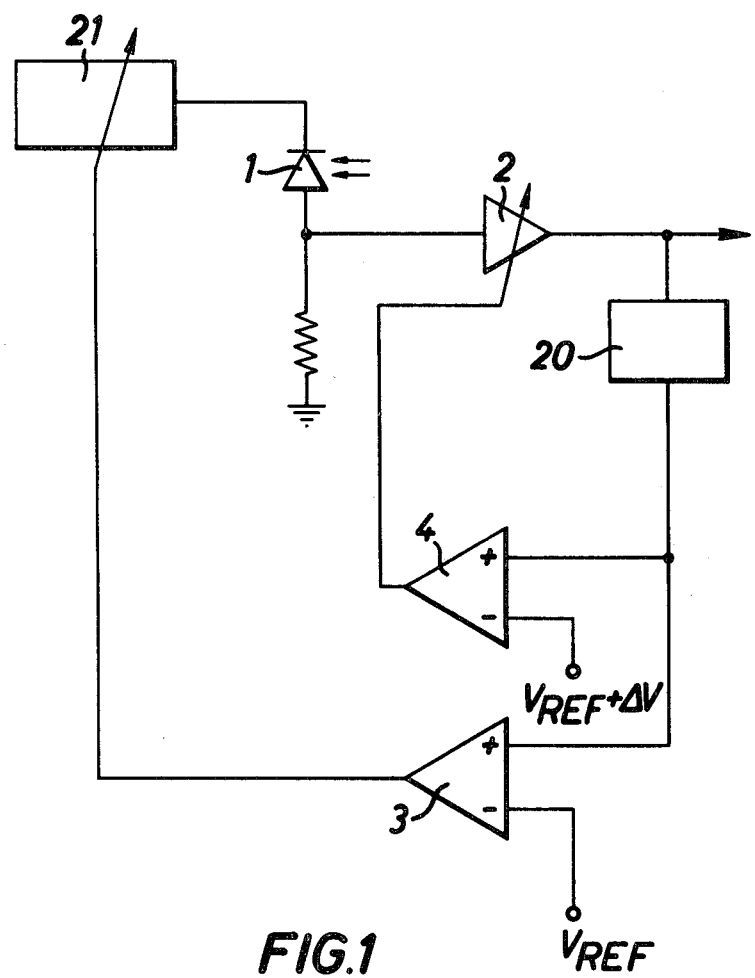
FIG. 1 is a simplified block schematic illustration of a level stabiliser according to the invention.

Referring to FIG. 1 a signal level stabiliser includes a series connected avalanche photo diode 1 and a power amplifier 2. The photo diode 1 and the amplifier 2 form the receiving and amplifying stages of a repeater for use in boosting an optical signal in an optical communications link.

The output terminal of the amplifier 2 is connected via a peak detector 20 to one input terminal of a comparator 3 and to one input terminal of a comparator 4. The output terminal of the comparator 4 is connected back to an input terminal of the amplifier 2 to provide a feedback loop to this amplifier. The output terminal of the comparator 3 is connected via a dc to dc converter 21 to the cathode of the photo diode 1 to provide a feedback loop to the series connected photo diode and amplifier. The voltages with which the output voltage of the amplifier 2 is compared in the comparators 3 and 4 are supplied to further input terminals of these comparators as will be described.

Figure 2:
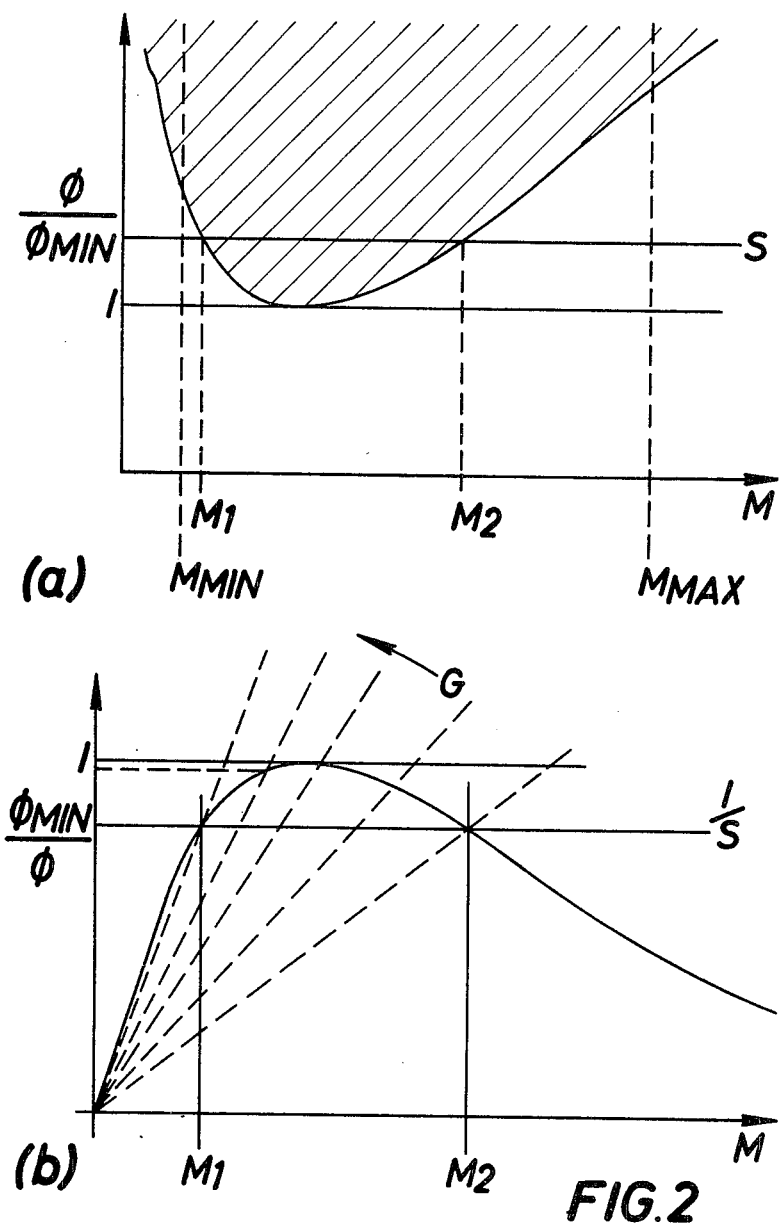
FIG. 2 is a graphical indication of operating considerations for an avalanche photo diode.

The essential action of the level stabiliser is to produce a substantially constant peak level output signal with high signal to noise ratio for a wide range of optical input powers and in spite of fluctuations in temperature which might cause changes especially in the operating characteristics of the photo diode 1. The gain M of the photo diode 1 has a minimum permissible value $M_{min}$ below which significant waveform distortion occurs and a maximum value $M_{max}$ determined by applied bias voltage. The optical peak power received at the photo diode input may lie within a fairly large range of values. The received power $\phi$ must be larger than the minimum detectable power since, if the minimum detectable power $\phi(min)$ is incident upon the photo diode there is only a single value of the gain M at which the required signal to noise ratio X can be achieved. This is illustrated in FIG. 2(a) which is a graph of the ratio $\phi/\phi(min)$ against the photo diode gain M, where the shaded region represents a signal to noise ratio X that is equal or greater that the desired minimum $X_{min}$. If the minimum received power $\phi$ is made greater than the minimum detectable power $\phi(min)$ by a "safety factor" this ensures that the required signal to noise ratio is attained for a range of values, $M_1$–$M_2$ of the photo diode gain M. One of the functions of the level stabiliser is to ensure that the photo diode gain is always within this range when low optical power levels are being received. At higher power levels, the value of photo diode gain is less critical.

When the system is operated with a particular safety factors, there are two extreme values of photo diode gain $M_1$ and $M_2$ at which the required signal to noise ratio is just maintained. This is illustrated in FIG. 2(b) where the ratio $\phi(min)/\phi$ is shown plotted against M; possible constant output voltages are represented by dotted lines. Operational restrictions on the region in which $X \geq Xmin$ are imposed by the minimum and maximum photo diode gains mentioned previously. The comparators 3 and 4 act to maintain the output voltage $V_0$ substantially constant with changing input optical power $\phi$ by varying the gain M of the photo diode 1 or the gain G of the amplifier 2, the output voltage $V_0$ being proportional to the product $G.M.\phi$. The gain G of the amplifier 2 is set so that the gain M of the photo diode 1 is between those two extreme values $M_1$ and $M_2$ permitted for the chosen safety factor governing the minimum received power. The amplifier gain G must be sufficiently stable with respect to temperature, etc, for the photo diode gain M to remain between its extreme values $M_1$ and $M_2$ when operating at the minimum received power. Hence the tolerance on the amplifier gain G is determined by the safety factor. This arrangement compensates for differences in photo diode characteristics in different diodes and those changes in operating conditions caused by temperature fluctuation.

Figure 3:
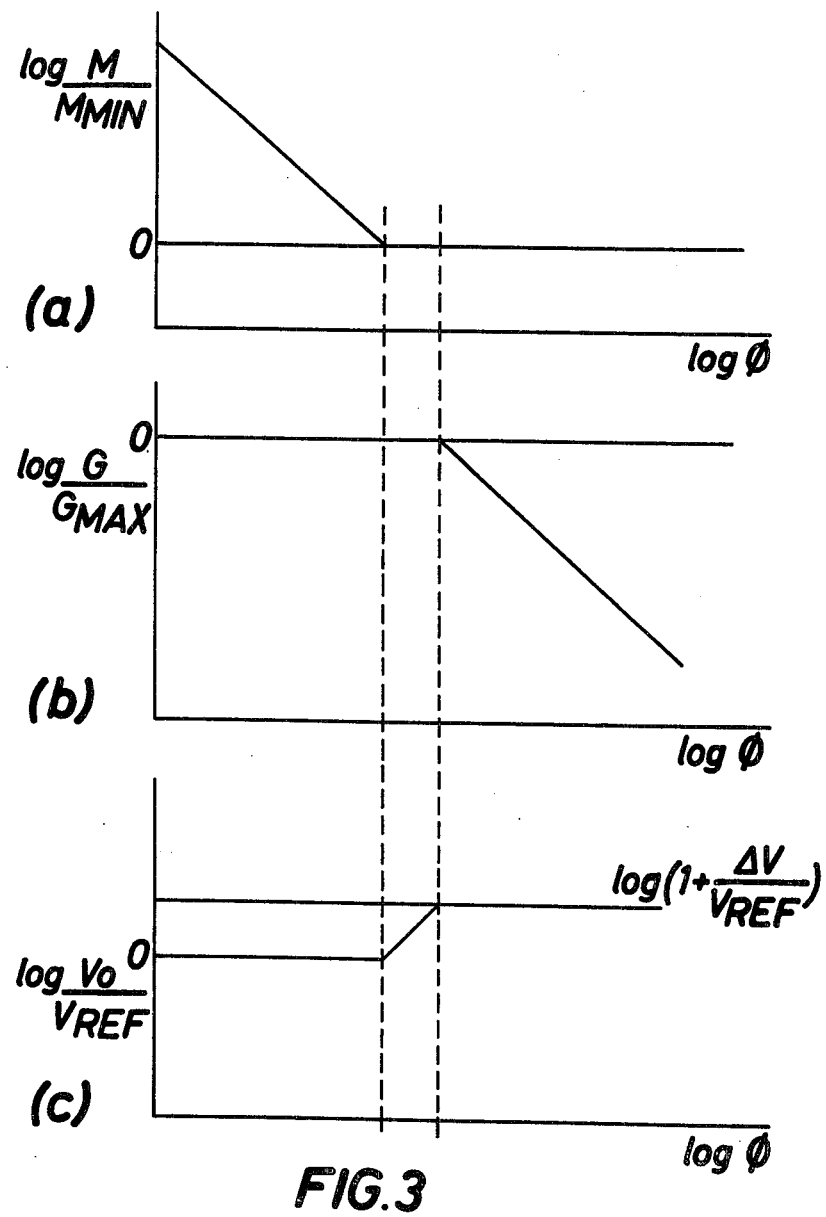
FIG. 3 shows three (a), (b) and (c) graphical representations of input optical power against variables dependent upon respectively photo diode gain, amplifier gain and output signal level.

Because the gain of the photo diode must be maintained above a predetermined lower limit to avoid distortion, the range of gain control permitted by varying the photo diode gain M is limited. Accordingly, further gain reduction is obtained by varying the amplifier gain G. As the received signal power $\phi$ increases progressively from its minimum value, initially the comparator 3 alters the photo diode gain M as shown in FIG. 3(a) to maintain the circuit output voltage $V_0$ applied to one input terminal equal to the reference voltage Vref applied to its other input terminal as shown in FIG. 3(c). The reference voltage applied to the input terminal of comparator 4 equals Vref + $\Delta$V, where $\Delta$V is very small compared with Vref. Since $V_0$ is less than Vref + $\Delta$V, then during the period when the gain of the photo diode 1 is greater than $M_{min}$ the comparator 4 maintains the amplifier gain G at a maximum $G_{max}$ as shown in FIG. 3(b), the value of the $G_{max}$ being such that the photo diode gain M lies between its two extreme values $M_1$ and $M_2$ when working at its minimum received power.

Figure 4:
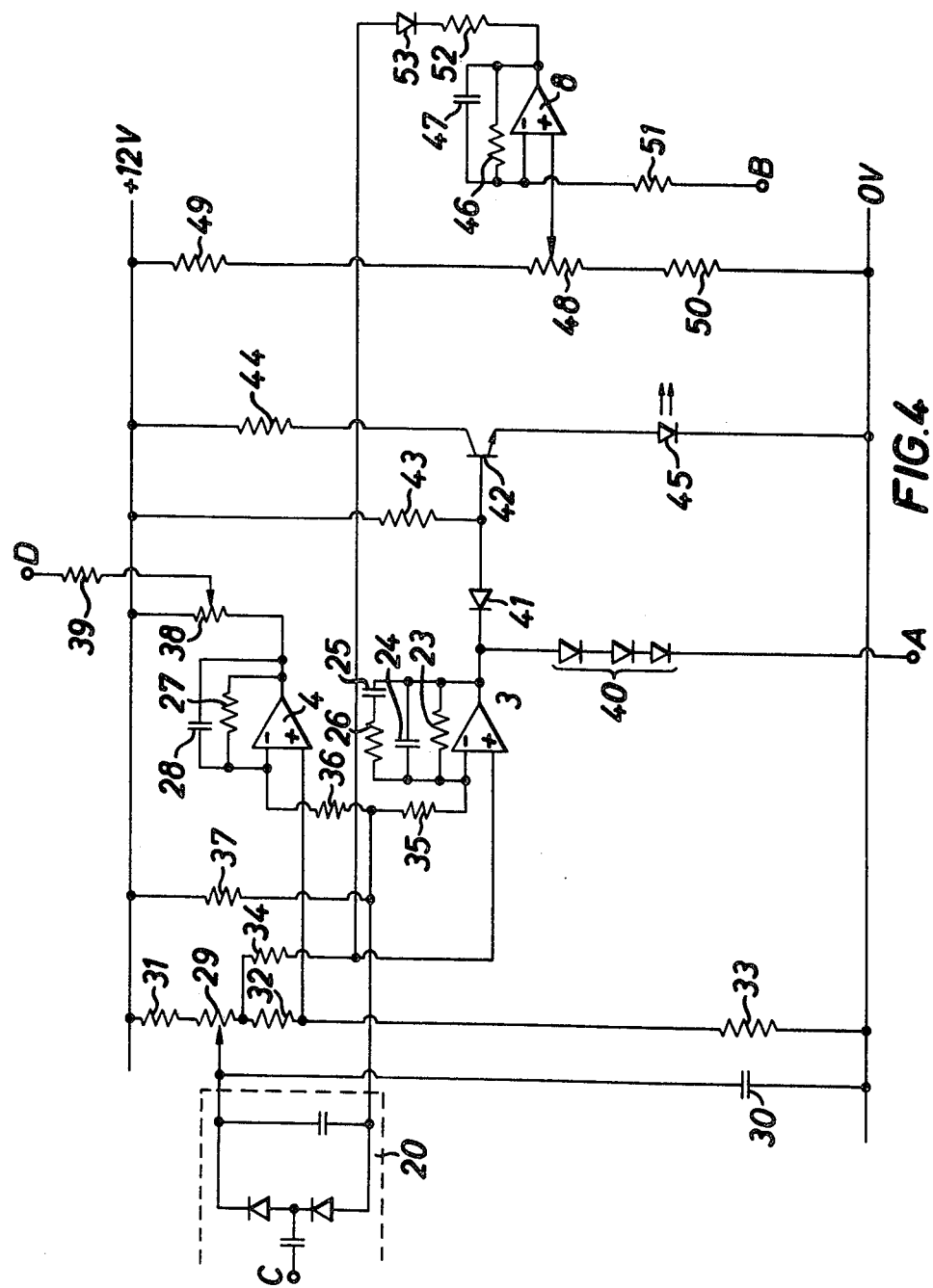
FIG. 4 shows detailed control circuitry of part of the level stabiliser.

Referring now to FIG. 4, the comparators 3 and 4 comprise respectively 741 differential input operational amplifiers 3a and 4a with negative feedback. The amplifier 3a has three parallel feedback paths via respectively a resistor 23 (8.2 M$\Omega$), a capacitor 24 (0.1 $\mu$f) and a capacitor 25 (4.7 $\mu$f) in series with a resistor 26 (39 K$\Omega$). The amplifier 4a has two parallel feedback paths via respectively a resistor 27 (8.2 M$\Omega$) and a capacitor 28 (0.47 $\mu$f). The output terminal of the amplifier 2 is connected to an input terminal C of the peak level detector 20. One output terminal of the level detector 20 is connected to the tapping point of a variable resistor 29 (500$\Omega$). A capacitor 30 (2.2 $\mu$f) is connected between the output terminal of the detector 20 and a 0 volts supply line. One terminal of the variable resistance 29 is connected via a resistor 31 (620$\Omega$) to a +12 volts supply line and its other terminal is connected via series resistors 32 (22$\Omega$) and 33 (1.1 k$\Omega$) to the 0 volts line.

The non-inverting input terminal of the amplifier 4a is connected to the junction between the resistors 32 and 33, and the non-inverting input terminal of the amplifier 3a is connected via a resistor 34 (10k$\Omega$) to the junction between the resistors 29 and 32. The inverting input terminals of the amplifiers 3a and 4a are connected via respective resistors 35 (16k$\Omega$) and 36 (16k$\Omega$) to one terminal of a resistor 37 (240k$\Omega$) whose other terminal is connected to the +12 volts line and to a further output terminal of the peak detector 20. The output terminal of the amplifier 4a is connected via a variable resistor 38 (5k$\Omega$) to the +12 volts line. The tapping point of the resistor 38 is connected via a resistor 38 (51K$\Omega$) to a terminal D which is connected to the control terminal of the amplifier 2. The output terminal of the amplifier 3a is connected via 3 series-connected diodes 40 to a terminal A which is the input terminal of the dc to dc converter 21. The output terminal of the amplifier 3a is also connected to the cathode of a diode 41 whose anode is connected to the base terminal of an npn transistor 42, the anode of this diode also being connected via a resistor 43 (91k$\Omega$) to the +12 volts line. The collector terminal of the transistor 42 is connected via a resistor 44 (510$\Omega$) to the +12 volts line and its emitter terminal is connected via light-emitting diode 45 to the 0 volts line. The diode 45 acts as an indicator lamp.

A further comparator is provided by a 741 operational amplifier 8 having two negative feedback paths via respectively a resistor 46 (8.2M$\Omega$) and a capacitor 47 (0.15 $\mu$f). The non-inverting input terminal of the amplifier 8 is connected to the tapping point of a variable resistor 48 (100k$\Omega$) which forms part of a potential divider comprising the resistors 49 (51k$\Omega$), 48, and 40 (51k$\Omega$) between the +12 volts and 0 volts lines. The amplifier 8 is arranged to compare a small voltage from the dc to dc converter 21 with a reference voltage determined by the potential divider. The small voltage from the dc to dc converter is supplied to a terminal B which is connected via a resistor 51 (12k$\Omega$) to the inverting input terminal of the operational amplifier 8. The output terminal of the amplifier 8 is connected via a resistor 52 (6.2 k$\Omega$) to the cathode of a diode 53 whose anode is connected to the non-inverting input terminal of the amplifier 3a.

Figure 5:
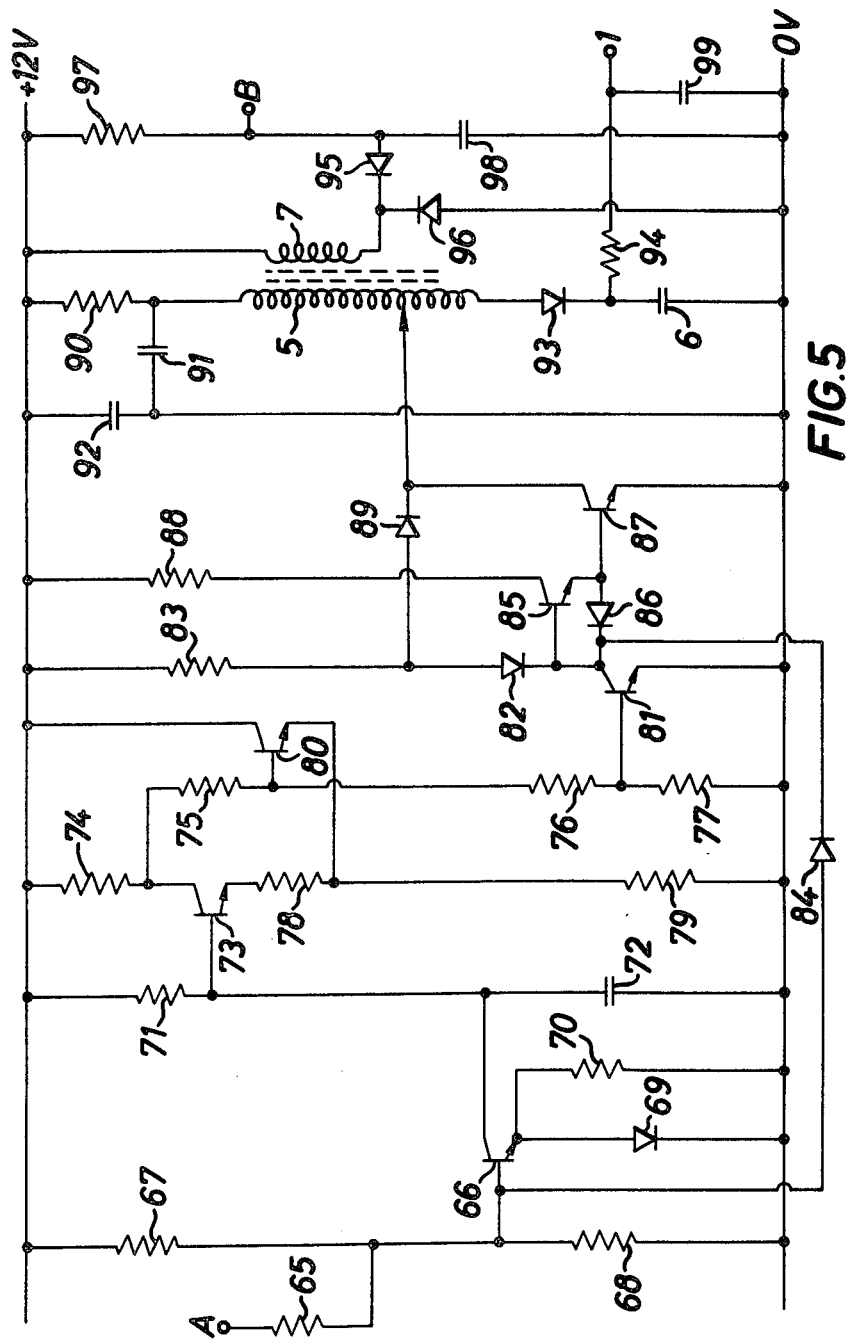
FIG. 5 is a circuit diagram of a dc to dc converter forming another part of the level stabiliser.

Referring now to FIG. 5, the dc to dc converter 21 includes a resistor 65 (51k$\Omega$) connected between the control terminal A and the base terminal of an npn transistor 66. The base terminal of the transistor 66 is also connected to the junction between two resistors 67 (160 kΩ) and 68 (15kΩ) which are connected between the +12 volts and 0 volts lines. The emitter terminal of the transistor 66 is connected via parallel paths including respectively a bypass diode 69 and a resistor 70 (2.2kΩ) to the 0 volts line. The collector terminal to the transistor 66 is connected to the junction between a resistor 71 (390kΩ) and a capacitor 72 (47 nf) which are connected between the +12 volts and 0 volts lines. The base terminal of an npn transistor 73 is also connected to the junction between the resistor 71 and the capacitor 72. The collector terminal of the transistor 73 is connected to the +12 volts line by a resistor 74 (33kΩ) and to the 0 volts line by series resistances 75 (62kΩ), 76 (91kΩ) and 77 (12kΩ). The emitter terminal of the resistor 73 is connected to the 0 volts line by series resistances 78 5.1kΩ) and 79 (33 kΩ). An npn transistor 80 associated with the transistor 73 has its base terminal connected to the junction between the resistors 75 and 76, its collector terminal connected to the +12 volts line and its emitter terminal connected to the junction between the resistors 78 and 79.

An npn transistor 81 has its base terminal connected to the junction between the resistors 76 and 77, its emitter terminal connected to the 0 volts line, and its collector terminal connected via a diode 82 and a resistor 83 (18 kΩ). Further connections from the collector terminal of the transistor 81 comprise a connection to the cathode of a diode 84 whose anode is connected to the base of the transistor 66, a connection to the base of an npn transistor 85, and a connection to the cathode of a diode 86 whose anode is connected to the base of an npn transistor 87. The collector terminal of the transistor 85 is connected to the +12 vols line via a resistor 88 (11 k Ω) and the emitter terminal of this transistor is connected to the base of the transistor 87. The emitter terminal of the transistor 87 is connected to the 0 volts line and its collector terminal is connected to the cathode of a diode 89 whose anode is connected to the anode of the diode 82.

A transformer having a primary coil 5 of 500 turns and a secondary coil of 15 turns is connected between the +12 volts and 0 volts lines. The positive terminal of the primary coil 5 is connected to the +12 volts line via a resistor 90 (2 k Ω) and also via series capacitors 91 (10 μf) and 92 (10 μf). The junction between the capacitors 91 and 92 is connected to the 0 volts line. The negative terminal of the primary coil 5 is connected to the anode of a diode 93 whose cathode is connected via a storage capacitor 6 to the 0 volts line. The junction between the diode 93 and the capacitor 6 is connected via a resistor 94 to the cathode of the photo diode 1. A capacitor 99 (0.1 μf) is connected between this cathode and the 0 volts line. The collector terminal of the transistor 87 is connected to a tapping point of the primary coil 5 dividing the coil into two portions of 250 turns each.

One terminal of the secondary coil 7 is connected to the +12 volts line and its other terminal is connected to the respective cathodes of two blocking diodes 95 and 96. The anode of the diode 96 is connected to the 0 volts line. The anode of the diode 95 is connected to the junction between a resistor 97 (510 kΩ) and a capacitor 98 (0.1 μf) which are connected respectively to the +12 volts and 0 volts lines. The terminal B connected to the operational amplifier 8 (FIG. 4) is connected to the junction between the resistor 97 and the capacitor 98.

The output voltage $V_0$ from the amplifier 2 is compared at operational amplifier 3a with the reference voltage Vref determined by th variable resistor 29. The output voltage from the amplifier 3a appears at the terminal A. As the optical signal level increases the output voltage $V_0$ tends to exceed the reference level Vref. The transistor 87 is cyclically switched to make and break the current through the primary winding 5. The charge fed to the capacitor 6 during each cycle depends on the time for which current flows through the coil and this time is determined by the control voltage at terminal A.

The voltage induced in the secondary coil 7 is proportional to the biasing voltage on the capacitor 6. This low voltage is applied to the terminal B and is compared at the operational amplifier 8 with a reference voltage proportional to the minimum bias voltage that gives the photodiode a gain of $M_{min}$. When the bias voltage approaches this minimum value the output signal from the amplifier 8 ensures that the voltage at the noninverting input terminal of amplifier 3a remains such tht the gain of the photo diode 1 is not reduced further. At this stage in the operation of the stabiliser the output voltage $V_0$ may increase slightly to Vref + $\Delta V$, the reference voltage of amplifier 4a, and $V_0$ is maintained at this value by the amplifier 4a whose output voltage applied to terminal D and thence to the control terminal of amplifier 2 to reduce the gain of this amplifier in response to further increase in the optical signal level.

As a result of the fact that the reference voltages in the two comparators 3 and 4 are different it is ensured that there is a unique combination of photo diode gain M and amplifier gain G for any level of received optical power, $V_0$ is maintained substantially constant by chosing $\Delta V$ as a very small value compared with Vref.

What we claim is:

1. A signal level stabilizer for producing, in response to optical input signals having powers within a range of optical powers, an output electrical signal having a substantially constant peak level and having a signal to noise ratio greater than a predetermined value, the stabilizer including:

a first amplifier for receiving the optical signal and producing a first electrical signal in response;

a second amplifier for producing the output electrical signal in response to said first electrical signal; and first and second feedback loops controlling respectively the gains of said first and second amplifiers so that for a range of input signal powers below a predetermined level the gain of one of said amplifiers is maintained at a substantially constant value and the gain of the other amplifier is automatically controlled to produce said constant level output electrical signal, and for input signals having powers above said predetermined level the gain of said one amplifier is automatically controlled to produce said constant level output electrical signal;

wherein, for fixed values of the power of the input signal and for fixed values of the gain of the second amplifier, particular values of the stabilizer signal to noise ratio are exactly achieved with either of two respective positive values of the gain of the first amplifier and increases to a maximum between these values, so that for each particular value of the signal to noise ratio there is a unique minimum value of the input signal power for which only one value of the gain of the first amplifier corresponds, and wherein the gain of the second amplifier, is chosen such that the first amplifier has a gain equal or close to the unique value of its gain corresponding to the minimum value of the power of the input signal consistent with the predetermined value of the signal to noise ratio when input signals having powers close to this minimum power are received.

2. A signal level stabilizer as claimed in claim 1 wherein said one of the amplifiers is the second amplifier and said other amplifier is the first amplifier.

3. A signal level stabilizer as claimed in claim 2, wherein said first feedback loop controls the gain of said first amplifier to a first lower limit, and said second feedback loop controls the gain of said second amplifier to a second lower limit, said first feedback loop being operative to vary the gain of said first amplifier in response to variations in the level of the input signal when the input signal is below said predetermined level and said second feedback loop being operative to vary the gain of said second amplifier in response to variations in the level of the input signal, when the input signal is above the predetermined level, this predetermined level is that at which the gain of said first amplifier is reduced to its lower limit.

4. A signal level stabilizer as claimed in claim 3 wherein said first feedback loop includes a first comparator and said second feedback loop includes a second comparator, said comparators being operative to compare the output electrical signal with respective reference signals, the reference signal of said second comparator being fractionally larger than the reference signal of said first comparator.

5. A signal level stabilizer as claimed in claim 4 wherein the amplitude of the output electrical signal is equal in magnitude to the reference signal of the first comparator for input signals having powers below said predetermined level and is equal in magnitude to the reference signal of said second comparator for input signals having powers above said predetermined level, the magnitudes of the reference signals being only slightly different so that the amplitude of the output electrical signal is maintained substantially constant.

6. A signal level stabilizer as claimed in claim 4 including a dc to dc converter connected between said first comparator and said first amplifying means for controlling the gain of said first amplifying means.

7. A signal level stabilizer as claimed in claim 6 wherein said first amplifying means is an avalanche photo diode and said second amplifying means is a power amplifier.

8. A signal level stabilizer as claimed in claim 7 wherein said dc to dc converter includes a primary induction coil and a reservoir capacitor connected to each other, the current through said primary induction coil being controlled by the output signal from said first comparator thereby controlling the charge on said reservoir capacitor, said reservoir capacitor providing the biasing voltage for said photo diode.

9. A signal level stabilizer as claimed in claim 8 wherein said dc to dc converter includes a secondary coil inductively coupled to said primary induction coil and operative to provide a low voltage output representative of the photo diode biasing voltage, and the stabilizer includes a third comparator which is operative to compare said low voltage output with a reference voltage to produce an output signal which prevents the biasing voltage of said photo diode being decreased below a level corresponding to said lower limit of the photo diode gain.

10. A signal level stabilizer as claimed in claim 9 wherein the output signal of said third comparator is connected to the input of said first comparator.

* * * * *